United States Patent
Brown

(10) Patent No.: US 7,990,796 B2
(45) Date of Patent: *Aug. 2, 2011

(54) ENERGY EFFICIENT MEMORY ACCESS TECHNIQUE FOR SINGLE ENDED BIT CELLS

(75) Inventor: Jeffrey S. Brown, Fort Collins, CO (US)

(73) Assignee: LSI Corporation, Milpitas, CA (US)

( * ) Notice: Subject to any disclaimer, the term of this patent is extended or adjusted under 35 U.S.C. 154(b) by 716 days.

This patent is subject to a terminal disclaimer.

(21) Appl. No.: 12/038,974

(22) Filed: Feb. 28, 2008

(65) Prior Publication Data

US 2008/0250257 A1 Oct. 9, 2008

Related U.S. Application Data

(63) Continuation-in-part of application No. 11/696,870, filed on Apr. 5, 2007, now Pat. No. 7,525,864.

(51) Int. Cl.
*G11C 5/14* (2006.01)
(52) U.S. Cl. .................. 365/227; 365/121; 365/189.15; 365/189.16; 365/203; 365/230.06
(58) Field of Classification Search .................. 365/227, 365/121, 189.15, 189.16, 203, 230.06
See application file for complete search history.

(56) References Cited

U.S. PATENT DOCUMENTS

| 5,559,741 A | 9/1996 | Sobue | 365/200 |
| 2005/0018519 A1* | 1/2005 | Nii | 365/227 |

* cited by examiner

*Primary Examiner* — Hoai V Ho
*Assistant Examiner* — Fernando N Hidalgo
(74) *Attorney, Agent, or Firm* — Christopher P. Maiorana, PC

(57) ABSTRACT

A method for conserving power in a device. The method generally includes the steps of (A) generating a polarity signal by analyzing a current one of a plurality of data items having a plurality of data bits, the polarity signal having an inversion bit indicating that the current data item is to be stored in one of (i) an inverted condition and (ii) a non-inverted condition relative to a normal condition such that a majority of the data bits have a first logic state, wherein reading one of the data bits having the first logic state consumes less power than reading one of the data bits having a second logic state, (B) selectively either (i) inverting the current data item or (ii) not inverting current the data item based on the inversion bit and (C) storing the current data item in a plurality of single-ended bit cells in the device.

20 Claims, 12 Drawing Sheets

TABLE I

| ORIGINAL DATA | NO. OF BITLINES THAT FALL TO WRITE/READ | ENCODED DATA WITH IBIT AS THE MSB | NO. OF BITLINES THAT FALL TO WRITE/READ |
|---|---|---|---|
| 0000 | 4 | 1 1111 | 0 |
| 0001 | 3 | 1 1110 | 1 |
| 0010 | 3 | 1 1101 | 1 |
| 0011 | 2 | 1 1100 | 2 |
| 0100 | 3 | 1 1011 | 1 |
| 0101 | 2 | 1 1010 | 2 |
| 0110 | 2 | 1 1001 | 2 |
| 0111 | 1 | 0 0111 | 2 |
| 1000 | 3 | 1 0111 | 1 |
| 1001 | 2 | 1 0110 | 2 |
| 1010 | 2 | 1 0101 | 2 |
| 1011 | 1 | 0 1011 | 2 |
| 1100 | 2 | 1 0011 | 2 |
| 1101 | 1 | 0 1101 | 2 |
| 1110 | 1 | 0 1110 | 2 |
| 1111 | 0 | 0 1111 | 1 |

FIG. 13

TABLE II

| MEMORY SIZE | TOTAL BITLINES TRANSITIONING TO READ A DATA = ADDR PATTERN | TOTAL BITLINES TRANSITIONING AFTER ENCODING DATA WITH IBIT | % REDUCTION IN THE NO. OF BITLINES THAT TOGGLE ON A FULL MEMORY READ |
|---|---|---|---|
| 16x4 | 32 | 25 | 21.88% |
| 32x5 | 80 | 66 | 17.5% |
| 64x6 | 192 | 154 | 19.79% |
| 128x7 | 448 | 372 | 16.96% |
| 256x8 | 1024 | 837 | 18.26% |
| 512x9 | 2304 | 1930 | 16.23% |
| 1024x10 | 5120 | 4246 | 17.07% |
| 2048x11 | 11264 | 9516 | 15.52% |
| 4096x12 | 24576 | 20618 | 16.11% |
| 8192x13 | 53248 | 45332 | 14.87% |
| 16384x14 | 114688 | 97140 | 15.30% |
| 32768x15 | 245760 | 210664 | 14.28% |

ENERGY EFFICIENT MEMORY ACCESS TECHNIQUE FOR SINGLE ENDED BIT CELLS

This is a continuation in part of U.S. Ser. No. 11/696,870, filed Apr. 5, 2007 now U.S. Pat. No. 7,525,864, which is hereby incorporated by reference in its entirety.

FIELD OF THE INVENTION

The present invention relates to nonvolatile memories generally and, more particularly, to an energy efficient memory access technique for single ended bit cells.

BACKGROUND OF THE INVENTION

Power consumed by a conventional Read Only Memory (ROM) device is data dependent. Data stored in a low voltage state consumes more power than data stored in a high voltage state due to increased bitline toggling. The toggling occurs when a pre-charged bitline is discharged while reading low voltage type data and then pre-charged again as part of a subsequent read.

Unused memory locations in the ROM are often padded to high voltage type values such that when addressed, the corresponding bitlines do not discharge. As such, the power consumption in the ROM will be low when addressing the unused locations. However, the padding only considers the unused address spaces. Padding offers no benefits to the overall power consumed when reading the full ROM.

SUMMARY OF THE INVENTION

The present invention concerns a method for conserving power in a device. The method generally comprises the steps of (A) generating a polarity signal by analyzing a current one of a plurality of data items having a plurality of data bits, the polarity signal having an inversion bit indicating that the current data item is to be stored in one of (i) an inverted condition and (ii) a non-inverted condition relative to a normal condition such that a majority of the data bits have a first logic state, wherein reading one of the data bits having the first logic state consumes less power than reading one of the data bits having a second logic state, (B) selectively either (i) inverting the current data item or (ii) not inverting the current data item based on the inversion bit and (C) storing the current data item in a plurality of single-ended bit cells in the device.

The objects, features and advantages of the present invention include providing an energy efficient memory access technique for single ended bit cells that may (i) reduce an average power consumption, (ii) be optimized from time to time to account for reprogrammable data sets and/or (iii) take planned data sets into consideration during fabrication.

BRIEF DESCRIPTION OF THE DRAWINGS

These and other objects, features and advantages of the present invention will be apparent from the following detailed description and the appended claims and drawings in which:

FIG. 13 is a table illustrating a 4-bit word power savings; and

FIG. 14 is a table illustrating power savings at various memory sizes.

DETAILED DESCRIPTION OF THE PREFERRED EMBODIMENTS

Power consumption in memories with single ended bit cell access is data dependent. If a low voltage bit (e.g., a logical zero) is programmed into a bit cell, the bit cell generally drives a pre-charged bitline low during a read access to sense the stored data. A pre-charge module may subsequently restore the charge on the bitline prior to the next access. Due to the high capacitance on the bitlines, a significant amount of power is usually spent reading a logical zero. If a high voltage bit (e.g., a logical one) is programmed into the bit cell, the bitline generally remains charged during the read access. As such, little power to no power consumption (e.g., $\sim CV^2$) may be associated with bitline movement when reading a logical one.

The present invention generally provides a programmable data inversion/non-inversion capability within an output data path of a memory device and a decision operation that determines how to program the inversion/non-inversion capability. Where the memory data is predominantly logical zeros, the data may be inverted on a bit-by-bit basis, stored in the device in the inverted condition, and inverted during a read to restore the data to the correct (e.g., normal) condition before leaving the device. Where the memory data is predominantly logical ones, the data may be stored as-is and not inverted during the read access. As such, the bitline toggling and power consumption associated with the stored data may be minimized. The inclusion of the inverter in the data output path may be achieved either as (i) a mask programmable step (e.g., similar to ROM data programming with a last ROMcode update prior to tapeout) or (ii) a permanent module controlled by a signal.

Figure 1:
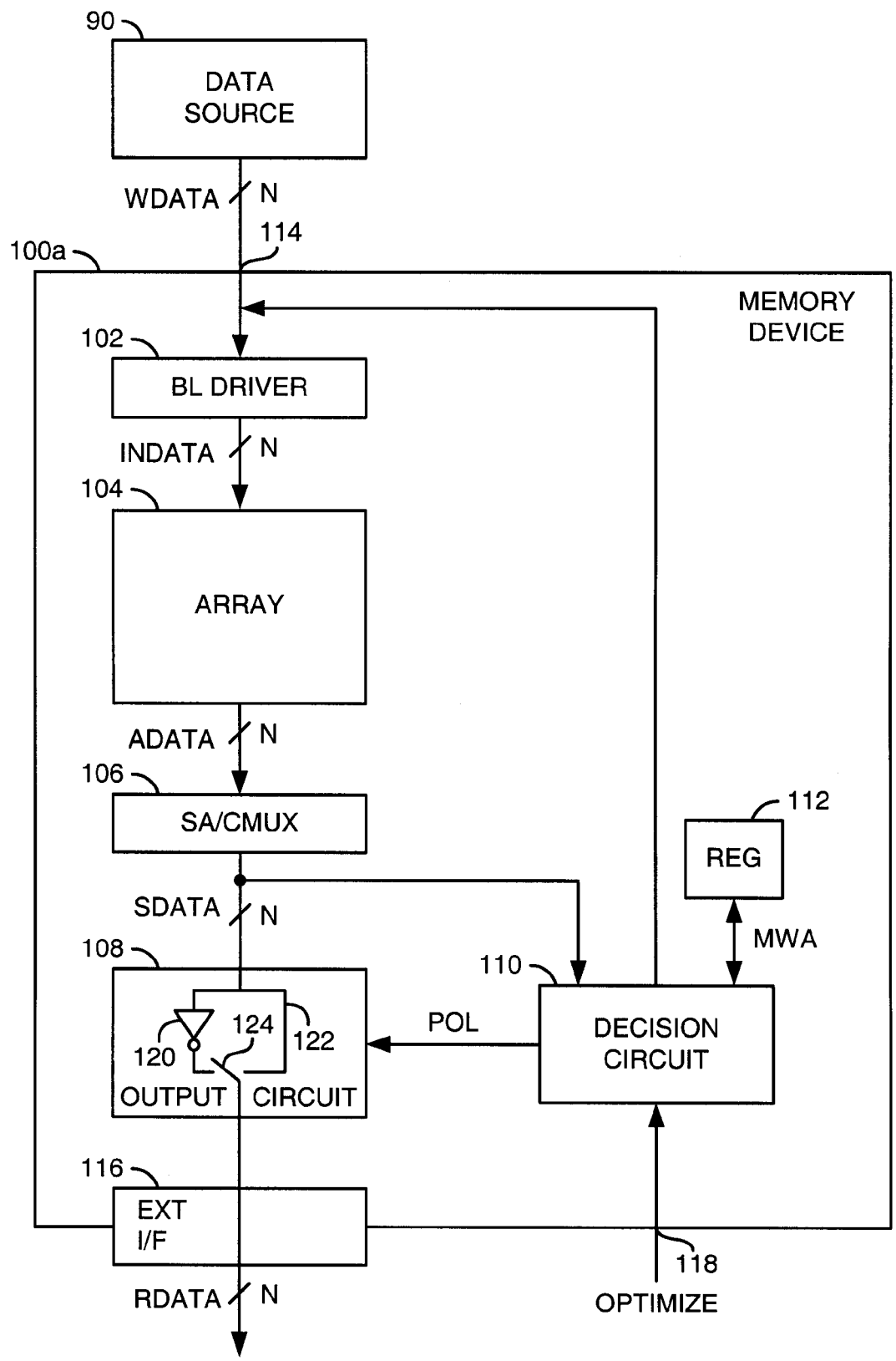
FIG. 1 is a block diagram of a first example implementation of a device in accordance with a preferred embodiment of the present invention.

Referring to FIG. 1, a block diagram of a first example implementation of a device 100a is shown in accordance with a preferred embodiment of the present invention. A data source 90 is illustrated as a source of one or more data items to be stored in the device 100a. The device 100a (or apparatus) generally comprises a circuit (or module) 102, a circuit (or module) 104, a circuit (or module) 106, a circuit (or module) 108, a circuit (or module) 110 and a circuit (or module) 112. An interface 114 may enable the device 100a to receive write data from the data source 90 via a signal (e.g., WDATA). Another interface 116 may be used to present read data from the device 100a in a signal (e.g., RDATA). An interface 118 may receive an optimization signal (e.g., OPTI-MIZE). In some embodiments, the interface 114 and the interface 116 may be the same physical interface.

The signal WDATA may be received by the circuit 102. The circuit 102 may generate and present a signal (e.g., INDATA) to the circuit 104. A signal (e.g., ADATA) may transfer data items from the circuit 104 to the circuit 106. The circuit 106 may generate and present a signal (e.g., SDATA) to both the circuit 108 and the circuit 110. The circuit 108 may present the signal RDATA through the interface 116. A signal (e.g., POL) may be generated by the circuit 110 and presented to the circuit 108. The circuit 112 may exchange a signal (e.g., MWA) with the circuit 110.

The device 100a may be implemented as a one-time programmable memory device or a reprogrammable memory device. One-time programmable type devices generally include, but are not limited to, read only memory (ROM), programmable read only memory (PROM), mask programmable memory, fuse programmable memory, anti-fuse programmable memory and laser programmable memory. Reprogrammable type devices generally include, but are not limited to, erasable PROM (EPROM), electronically erasable PROM (EEPROM), ultra-violet erasable PROM (UVPROM), Flash memory, bubble memory, ferro-electric memory, dynamic random access memory (DRAM) and static random access memory (SRAM). The device 100a may be designed as a stand alone memory and/or as part of a larger circuit, such as a microcontroller.

The circuit 102 may implement a bitline driver circuit. The circuit 102 is generally operational to drive data items received from the data source 90 onto the bitlines via the signal INDATA during a write operation to transfer data items into the bit cells of the circuit 104. The circuit 102 may drive N bitlines simultaneously, where N is an integer of one or greater.

The circuit 104 may be implemented as one or more arrays of bit cells. The circuit 104 may be configured to store the data items received from the circuit 102 during write operations. During a read operation, the circuit 104 may present the addressed data items (bit cells) in the signal ADATA. Storage of the data items may be arranged in sets of N bits per addressable unit. For example, the device 100a may be designed to store data items in units of 1 bit, 8 bits, 16 bits, 32 bits or 64 bits. Other word sizes may be implemented to meet the criteria of a particular application.

The circuit 106 generally implements multiple sense amplifiers (SA) and one or more column multiplexers (CMUX). The circuit 106 may be operational to sense a change in voltage on the bitlines (e.g., signal ADATA) during read operations to determine if the addressed bit cells contain logical one data or logical zero data. The circuit 106 may also be operational to multiplex data received in the addressed columns into the signal SDATA.

The circuit 108 may implement an output circuit. The circuit 108 is generally configured to generate the signal RDATA at the interface 116 by buffering the signal SDATA. The buffering may be selectively inverting or non-inverting as determined by a polarity command received in the signal POL. Where the signal POL commands an inversion, the circuit 108 may invert each individual bit in the signal SDATA to create the corresponding bits in the signal RDATA. Where the signal POL commands a non-inverting transfer, the circuit 108 may transfer each individual bit of the signal SDATA to the corresponding bit in the signal RDATA without altering the logic states.

The circuit 108 may be implemented by a variety of designs. For example, the circuit 108 may comprise an inverter 120, a non-inverting path 122 and a switch 124 for each of the N bits in the signal SDATA. The switch 124 may be controlled by the signal POL to generate the signal RDATA from the inverter 120 or the non-inverting path 122. In ROM type designs, the switch 124 may be eliminated if the data set is known before fabrication of the device 100a is finished. In such a case, the final tapeout of the device 100a may include only one of the inverter 120 or the non-inverting path 122 in the final design. In other designs, the circuit 108 may comprise a two-input exclusive OR gate for each bit, where one of the inputs receives the signal POL. Other designs may be implemented to meet the criteria of a particular application.

The circuit 110 may implement a decision circuit. The circuit 110 is generally operational to generate the signal POL based on the data items stored in the circuit 104. Once all of the data items have been loaded into the circuit 104, the circuit 110 may read each data item, count the total number of logical one bits and the total number of logical zero bits, then generate the signal POL accordingly. The following considers a case where the circuit 104 incorporates bitlines that are charged to a high voltage at the start of a read operation. The circuit 110 may generate the signal POL in (i) a non-inverting condition if a majority of the data items stored in the circuit 104 have the logical one (e.g., high voltage) state and (ii) an inverting condition if the majority of the data items have the logical zero (e.g., low voltage) state.

If the circuit 110 concludes that the majority of the data items are in the logical zero state, the circuit 110 may walk through the data items a second time performing a read-invert-write operation to change the majority from the logical zero state to the logical one state. Each data item may be read by the circuit 110 via the signal SDATA, inverted, and presented to the circuit 102 via the signal WDATA. The circuit 102 may write the inverted data item back into the circuit 104 and the process repeated with the next data item.

The circuit 112 may be implemented as an optional register. The circuit 112 generally stores a maximum write address that identifies a boundary between the written data items and unused bit cells set to a default logical state. The circuit 112 may be useful in situations where the data items occupy a fraction of the total capacity of the circuit 104. The circuit 110 may use the maximum write address (e.g., the signal MWA) to limit (i) the initial scan of the circuit 104 to the bit cells holding actual data and (ii) the read-invert-write pass through the circuit 104 to leave the unused bit cells in the default state (e.g., the power saving logical one state). In some situations where the data items fill virtually the entire circuit 104, the circuit 112 may be eliminated leaving the circuit 110 to treat all bit cells as if holding valid data.

By configuring the data items to be stored in predominantly the logical one state, the average $CV^2$ power consumed by the bitlines may be minimized. The average power savings may be most beneficial in larger memory arrays and/or frequently read memory arrays. In designs where the circuit 104 precharges the bitlines to the logical zero state, the circuit 110 may be configured to establish the majority of data items in the logical zero state to minimize power consumption due to bitline toggling during read operations.

Figure 2:
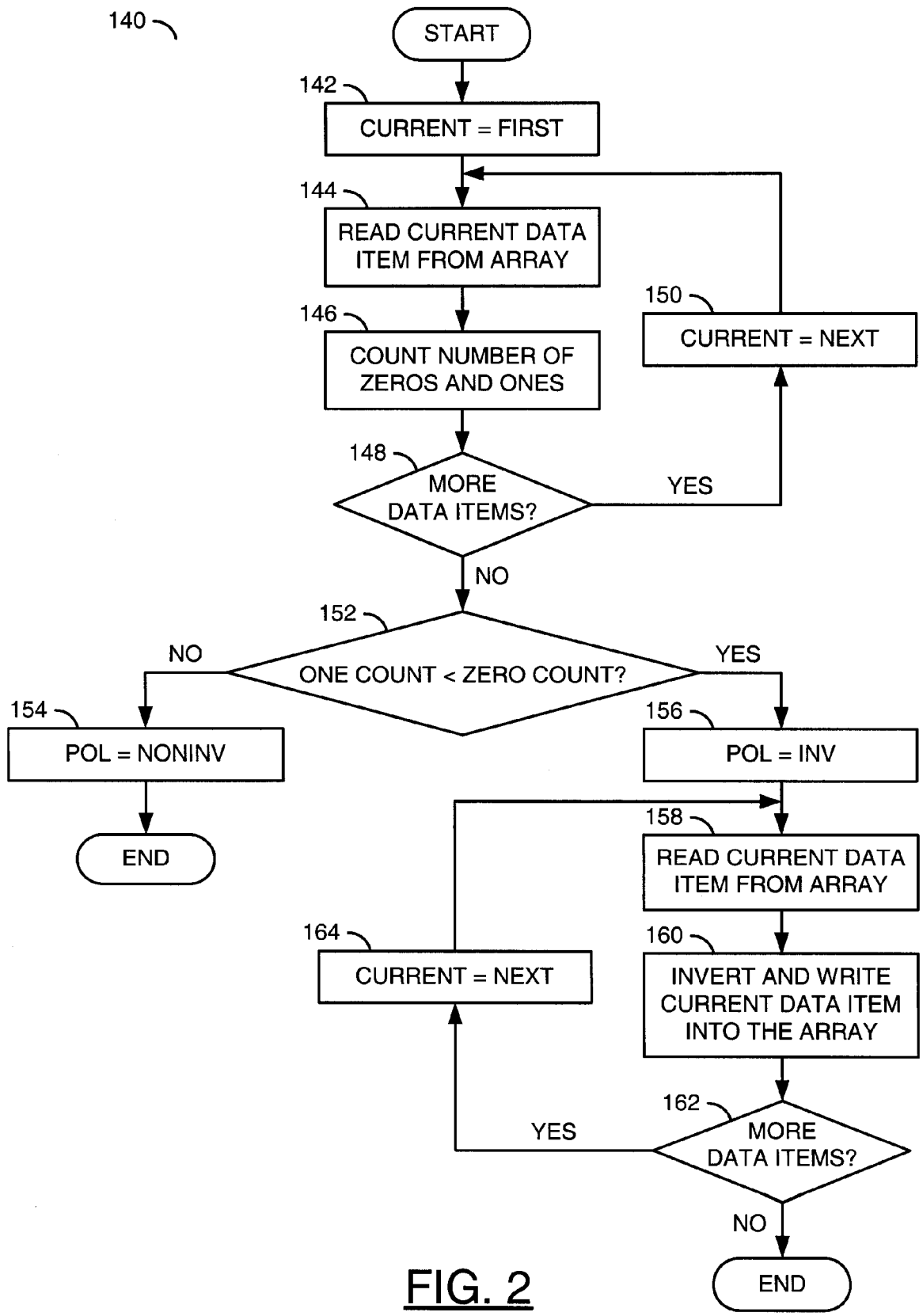
FIG. 2 is a flow diagram of a first example method to load data items into the device.

Referring to FIG. 2, a flow diagram of a first example method 140 to load data items is shown. The method (or process) 140 generally comprises a step (or block) 142, a step (or block) 144, a step (or block) 146, a step (or block) 148, a step (or block) 150, a step (or block) 152, a step (or block) 154, a step (or block) 156, a step (or block) 158, a step (or block) 160, a step (or block) 162 and a step (or block) 164. The method 140 may be implemented by the device 100a interacting with the data source 90.

In the step 142, the circuit 110 may begin an initial pass through the data items by initializing to a first address for the circuit 104. The initial pass may be triggered by (i) an assertion of the signal OPTIMIZE, (ii) an isolated change in one or more of the data items and/or (iii) a completion of a data set load from the data source 90.

A current data item stored at the current (first) address may be read from the circuit 104 to the circuit 110 in the step 144. The circuit 110 may count the number of bits in the current data item having the logical zero state and the number of bits in the current data item having the logical one state in the step 146. If more data items are available in the circuit 104 (e.g., the YES branch of step 148), the circuit may update the current address to the next (e.g., second) address in the step 150. Reading and counting may continue until all of the data items (as indicated by the signal MWA) have been checked. In some embodiments, the reading and counting may continue until all of the bit cells in the circuit 104 (including the unused bit cells) have been checked.

Upon completion of first scan (e.g., the NO branch of step 148), the circuit 110 generally compares the total number of logical zeros with the total number of logical ones just counted. If the logical zero count is not greater than the logical one count (e.g., the NO branch of step 152), the circuit 110 may set the signal POL to the non-inverting condition in step 154 and the method 140 may be ended. The data items as originally stored in the circuit 104 may be left alone (e.g., the data items may be in the normal condition as written).

If the logical zero count exceeds the logical one count (e.g., the YES branch of step 152), the circuit 110 may set the signal POL to the inverting condition in the step 156. Thereafter, the circuit 110 may begin a second pass through the data items to invert the normal state of each data item. In the step 158, a current (e.g., first) data item may be read from the circuit 104 to the circuit 110. The circuit 110 may invert the normal state of the current data item (e.g., logical one to logical zero or logical zero to logical one) then write the inverted data item back into the circuit 102 at the same address in the step 160. A check for the last data item is generally made after each write. If more data remains to be inverted (e.g., the YES branch of step 162), the circuit 110 may increment the current address to a next (e.g., second) address in the step 164. Processing of the data items may continue until all of the data items (or all of the bit cells) have been inverted. Once the second pass has completed (e.g., the NO branch of step 162), the method 140 may be ended.

Figure 3:
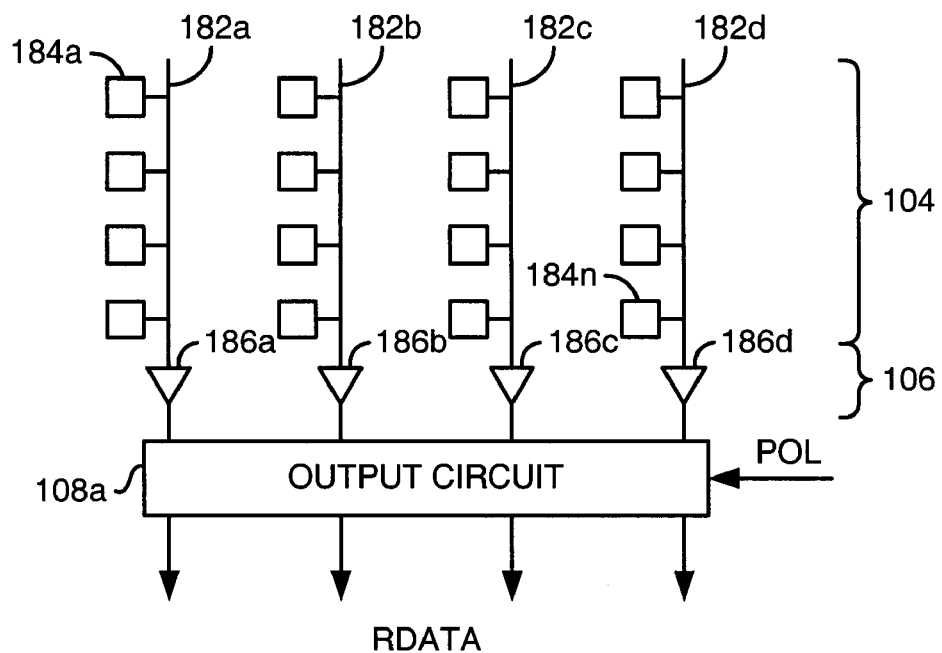
FIG. 3 is a detailed block diagram of a first example arrangement of an output circuit of the device.

Referring to FIG. 3 a detailed block diagram of a first example arrangement of an output circuit 108a is shown. The circuit 108a may be a variation of the circuit 108. The circuit 104 generally comprises multiple bitlines 182a-182d and multiple bit cells 184a-184n. A set of sense amplifiers 186a-186d in the circuit 106 may be connected at an end of the bitlines 182a-182d. The circuit 108a may be connected to the sense amplifiers 186a-186d. In the first arrangement, the circuit 104 may access data items as multi-bit (e.g., 4-bit) units. Furthermore, the circuit 108a may selectively invert/not invert all of the bits of each data item simultaneously based on the signal POL. If one bit of a data item is inverted, then all bits of all the data items are inverted. The first arrangement may be useful in situations where the logical ones and the logical zeros are uniformly scattered across the data items from the most significant bits to the least significant bits.

Figure 4:
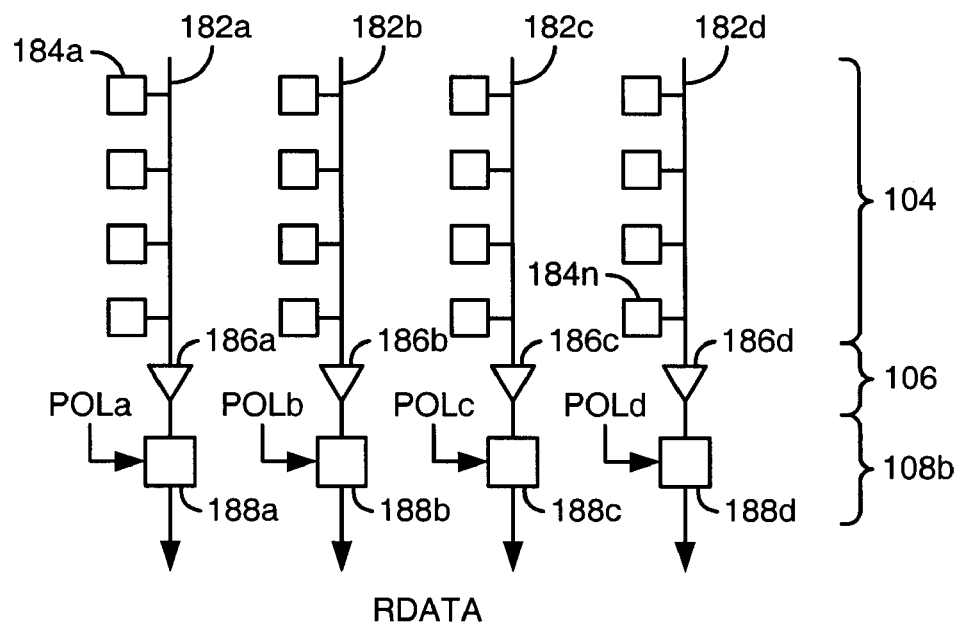
FIG. 4 is a detailed block diagram of a second example arrangement of the output circuit.

Referring to FIG. 4, a detailed block diagram of a second example arrangement of an output circuit 108b is shown. The circuit 108b may be a variation of the circuit 108. In the second arrangement, the data items may be accessed as either single-bit units or multi-bit units. The circuit 108b generally comprises multiple logic circuits 188a-188d. The signal POL may comprise multiple signals (e.g., POLa-POLd), one of the signals POLa-POLd for each respective logic circuit 188a-188d. Each of the logic circuits 188a-188d may be operational to invert/not invert a single bit in response to a respective signal POLa-POLd. In the second arrangement, some of the columns 182a-182d may store bits in the normal (original) state while other columns 182a-182d may store bits in an inverted state relative to the normal state. Furthermore, the method 140 may be adjusted to scan each of columns 182a-182d independently and then read-invert-write the individual columns where appropriate. The second arrangement may be useful in situations where one or more specific bit positions (e.g., the most significant bits) in some or all of data items have the same logical state. For example, 12-bit data items may be stored as 16-bit words with the upper 4 bits padded to logical zero. As such, the columns 182a-182d holding the upper 4 bits may be stored inverted (e.g., the logical one state) while the remaining lower 12 bits may be stored not inverted (e.g., a mixture of logical zero states and logical one states).

Figure 5:
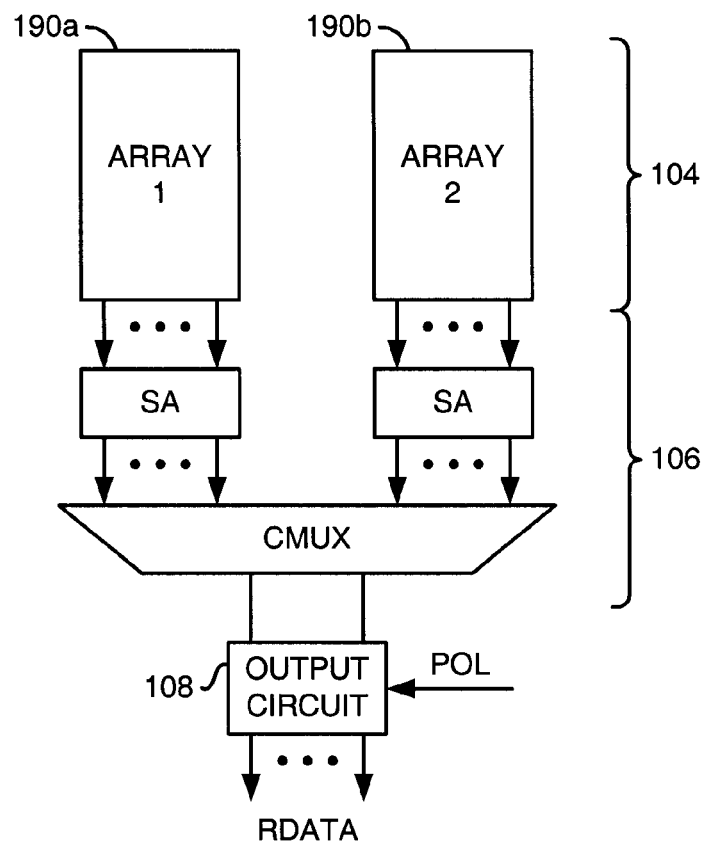
FIG. 5 is a detailed block diagram of an example arrangement of an array circuit of the device.

Referring to FIG. 5, a detailed block diagram of another example arrangement of the circuit 104 is shown. The circuit 104 may comprise multiple arrays (or modules) 190a-190b of bit cells. Each of the arrays 190a-190b may be configured as an independent block, page, region and/or set of the bit cells. The circuit 108 may be positioned after the column multiplexer such that the data items from each of the arrays 190a-190b are treated the same. If a data item from the array 190a is inverted by the circuit 108, then another data item from the array 190b may also be inverted.

Figure 6:
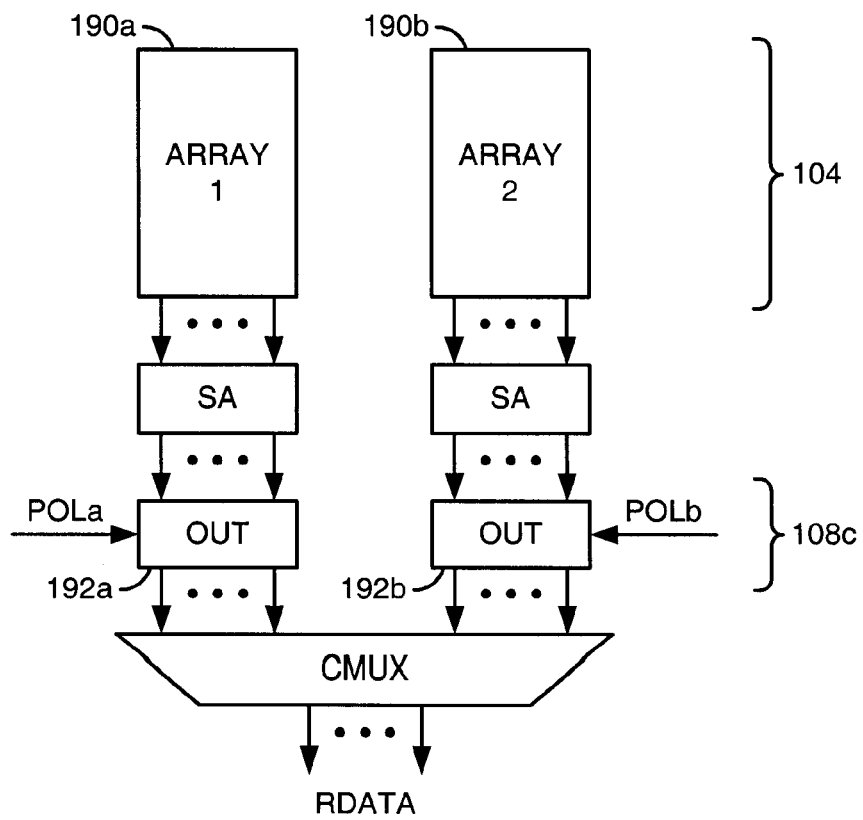
FIG. 6 is a detailed block diagram of a third example arrangement of the output circuit.

Referring to FIG. 6, a detailed block diagram of a third example arrangement of an output circuit 108c is shown. The circuit 108c may be a variation of the circuit 108a. The circuit 108c generally comprises multiple logic circuits (or modules) 192a-192b. The signal POL generally comprises multiple signals (e.g., POLa-POLb), one of the signals POLa-POLb for each respective logic circuit 192a-192b. Each of the arrays 190a-190b may be configured as an independent block, page, region and/or set of the bit cells. The circuits 192a-192b may be positioned between the sense amplifiers and the column multiplexer. As such, that data items in each array 190a-190b are inverted/not inverted independently of the data items is the other array 190a-190b. Independent inversion/non-inversion control for each of the arrays 190a-190b may be useful to shorten the time used to scan and possibly read-invert-write the data items. For example, while the circuit 90 is writing new data items into the array 190b, the circuit 110 may be simultaneously examining the data items previously stored in the array 190a to decide how to set the signal POLa. In another example, when one or more data items are changed in the array 190a, but none in the array 190b, the circuit 110 may examine only the array 190a to update only the signal POLa. No time may be spent looking at the data items in the array 190b as none were changed.

Figure 7:
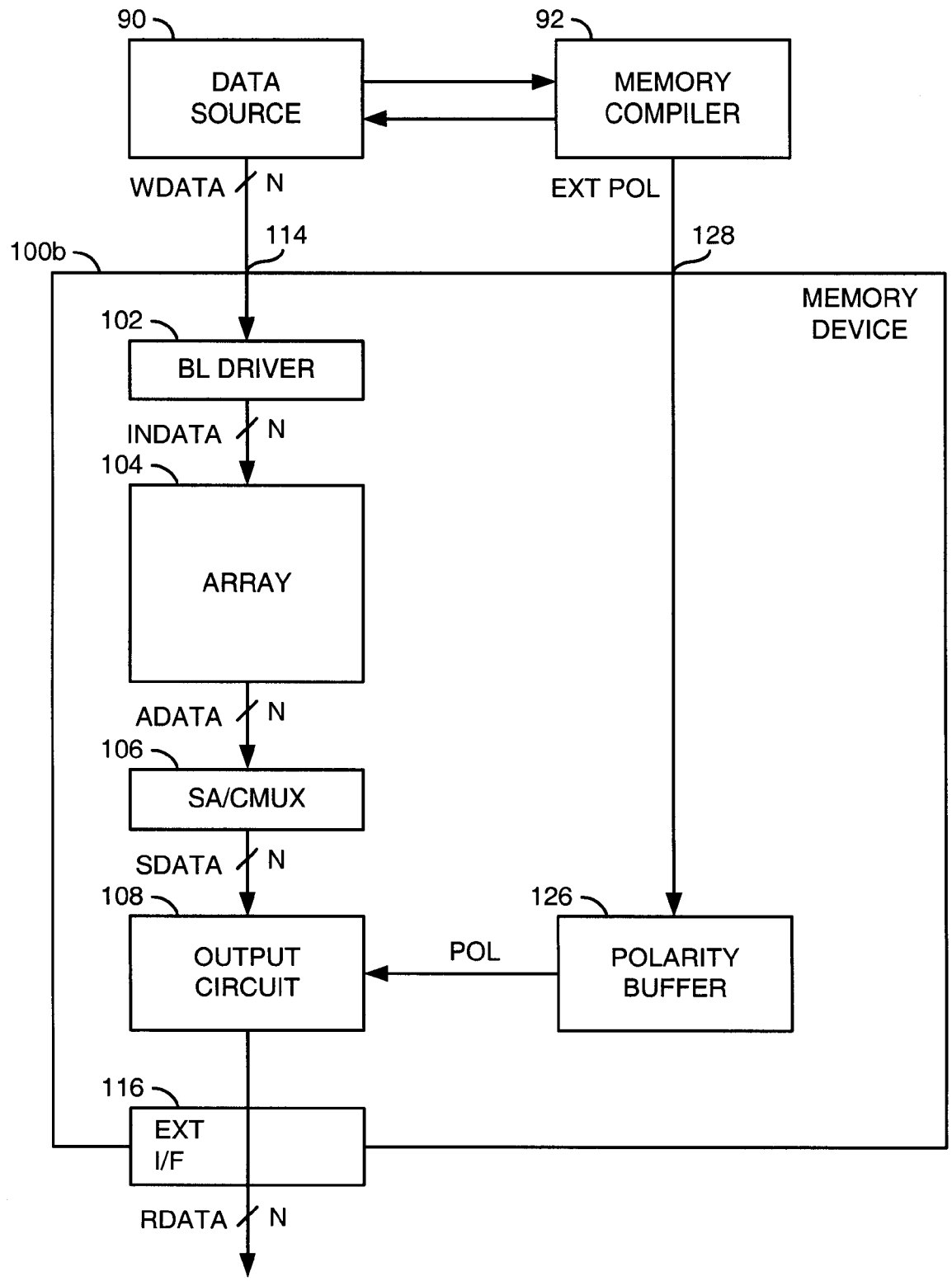
FIG. 7 is a block diagram of a second example implementation of the device.

Referring to FIG. 7, a block diagram of a second example implementation of a device 100b is shown. The device 100b may be a variation of the device 100a. A memory compiler 92 is illustrated as a source of an external polarity signal (e.g., EXTPOL) used by the device 100b. The device 100b generally comprises the circuit 102, the circuit 104, the circuit 106, the circuit 108 and a circuit (or module) 126. An interface 128 generally transfers the signal EXTPOL from the memory compiler 92 to the circuit 126. The circuit 126 may generate and present the signal POL to the circuit 108.

The circuit 126 may be implemented as a polarity signal buffer. The circuit 126 generally stores invert/non-invert information received from the compiler 92 via the signal EXTPOL. The invert/non-invert information programmed into the circuit 126 may be presented in the signal POL.

The compiler 92 is generally located outside the device 100b. The compiler 92 may be operational to determine if the data items transferred from the data source 90 to the device 100b are to be stored in the normal (non-inverted) condition or in the inverted condition to minimize the power consumption. A result of the decision is generally presented to the circuit 126 in the signal EXTPOL. As such, the circuit 126 may have a simple, small, low power design. The device 100b may be suited to memory technology where the bit cells within the circuit 104 can only be programmed once (e.g., mask programmable, fuse programmable, laser programmable and the like).

Figure 8:
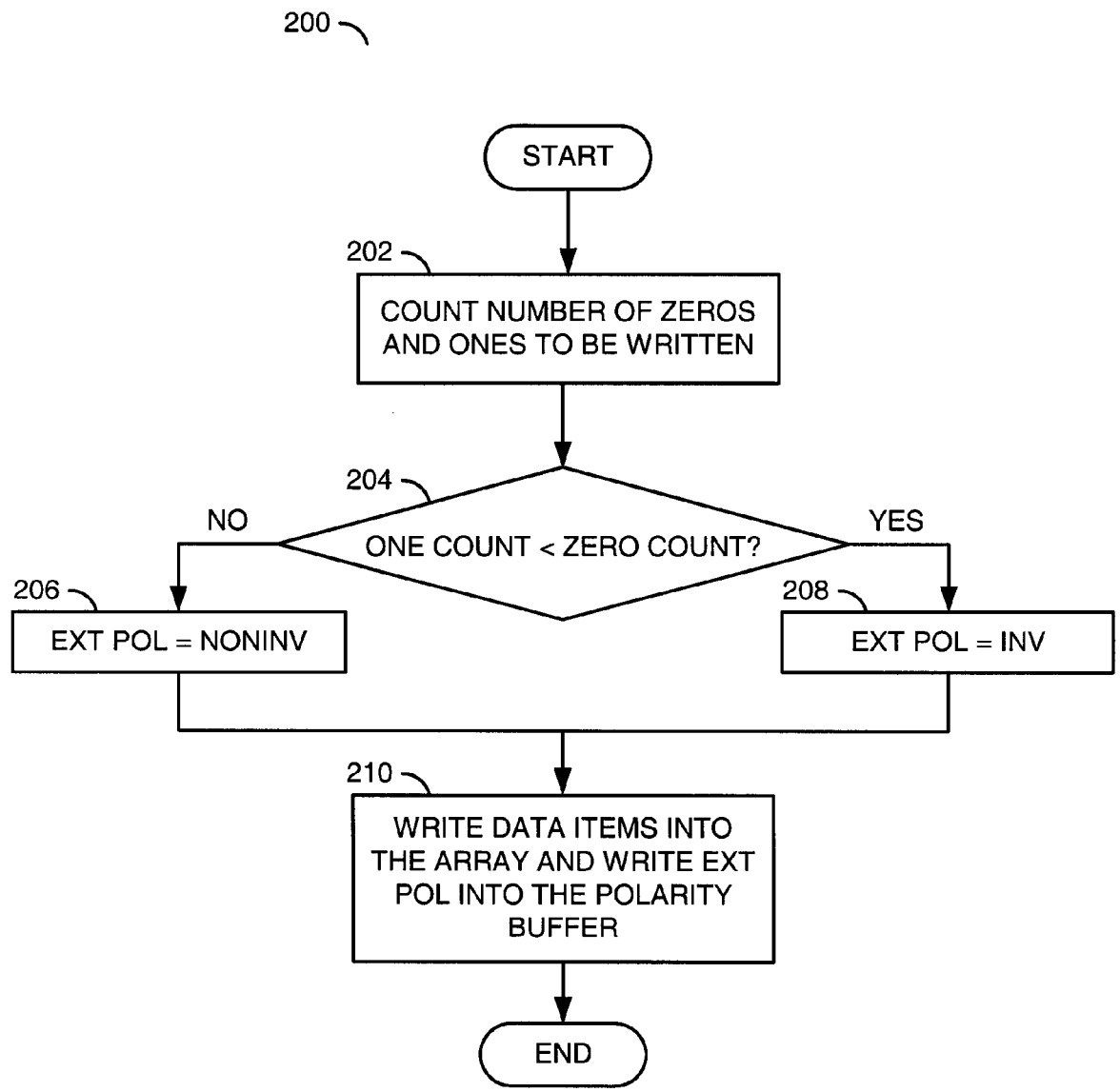
FIG. 8 is a flow diagram of a second example method of loading data items.

Referring to FIG. 8, a flow diagram of a second example method 200 of loading data items is shown. The method (or process) 200 generally comprises a step (or block) 202, a step (or block) 204, a step (or block) 206, a step (or block) 208 and a step (or block) 210. The method 200 may be implemented by the compiler 92 interacting with the data source 90 and the device 100b.

In the step 202, the compiler 92 may count the number of logical one bits and the number of logical zero bits in a data set held by the data source 90. In the step 204, the compiler 92 may check the logical one count against the logical zero count. If the logical zero count is not greater than the logical one count (e.g., the NO branch of the step 204), the compiler 92 may generate the signal EXTPOL in the non-inverting condition in the step 206. If the logical zero count is greater than the logical one count (e.g., the YES branch of step 204), the compiler 92 may generate the signal EXTPOL in the inverting condition in the step 208. The data source 90 may use the status of the signal EXTPOL to transfer either (i) the normal data set or (ii) an inverted data set to the device 100b in the step 210. The device 100b may store the received data set (data items) in the circuit 104 and store the condition of the signal EXTPOL in the circuit 126. Thereafter, the circuit 108 may present the data items at the interface 116 in the normal state by inverting/not inverting the data items read from the circuit 104 based on the inverting/non-inverting condition of the signal POL.

Figure 9:
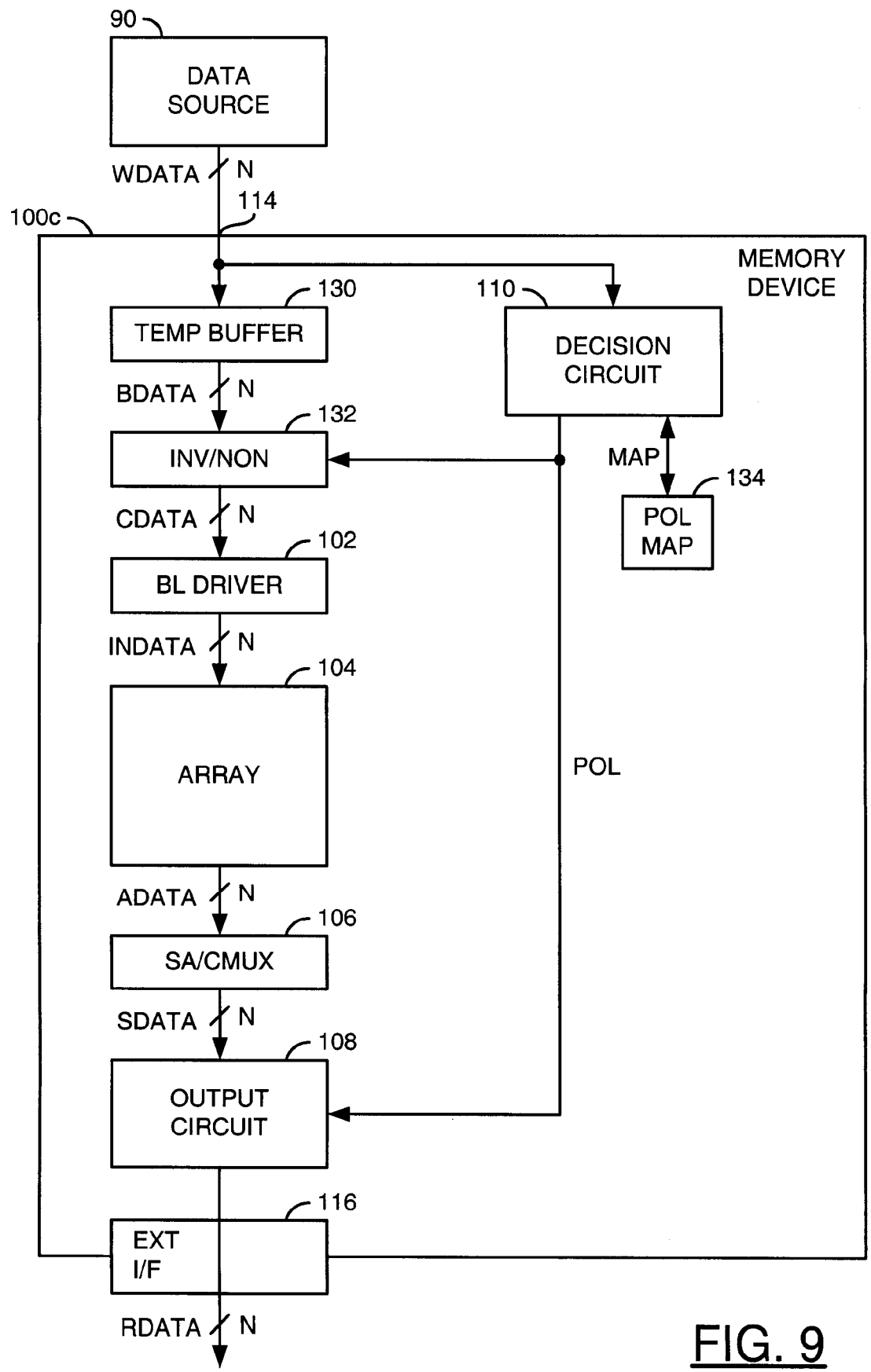
FIG. 9 is a block diagram of a third example implementation of the device.

Referring to FIG. 9, a block diagram of a third example implementation of a device 100c is shown. The device 100c may be a variation of the device 100a. The device 100c generally comprises the circuit 102, the circuit 104, the circuit 106, the circuit 108, the circuit 110, a circuit (or module) 130, a circuit (or module) 132 and a circuit (or module) 134. The circuit 130 may receive the signal WDATA from the data source 90 through the interface 114. A signal (e.g., BDATA) may be generated and presented from the circuit 130 to the circuit 132. The circuit 132 may generate and present a signal (e.g., CDATA) to the circuit 102. The signal POL may be presented from the circuit 110 to both the circuit 108 and the circuit 132. A signal (e.g., MAP) may be exchanged between the circuit 110 and the circuit 134.

The circuit 130 may be implemented as a buffer circuit. The circuit 130 is generally operational to temporarily buffer N columns of write data. The buffered data may be presented to the circuit 132 in the signal BDATA.

The circuit 132 may be implemented as a logic circuit. The circuit 132 may be a copy of the circuit 108. Operationally, the circuit 132 may selectively invert/not invert the data items in the signal BDATA to create the signal CDATA based on the condition of the signal POL.

The circuit 134 may implement a polarity map buffer. The circuit 134 may be programmed by the circuit 110 to store a map of polarity values for multiple regions of bit cells within the circuit 104. Each of the regions may be similar in size to the capacity of the circuit 130. The device 100c may be useful with both (i) memory technologies where the bit cells may be written only once and (ii) memory technologies where the bit cells may be written to many times.

Figure 10:
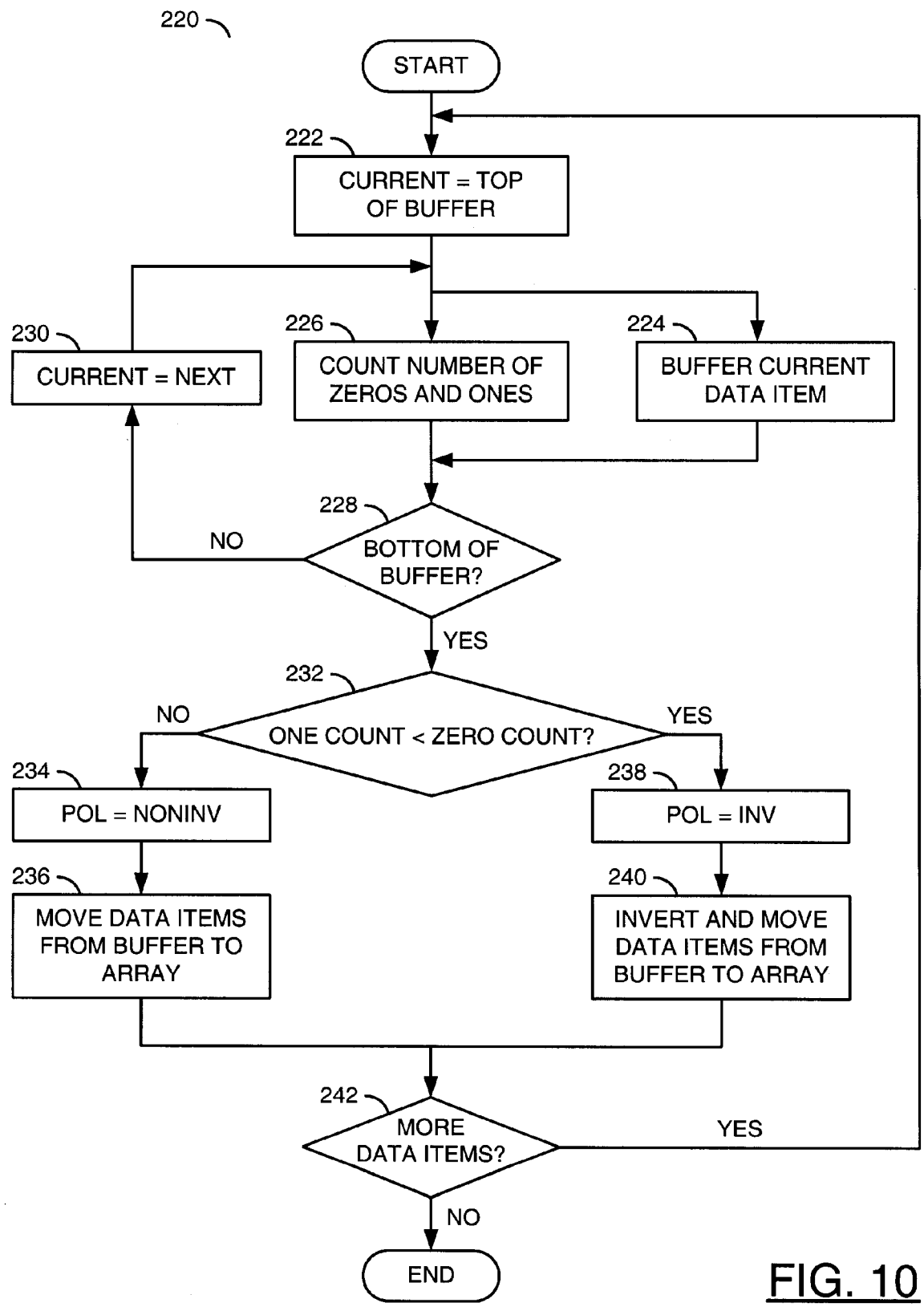
FIG. 10 is a flow diagram of a third example method of loading data items.

Referring to FIG. 10, a flow diagram of a third example method 220 of loading data items is shown. The method (or process) 220 generally comprises a step (or block) 222, a step (or block) 224, a step (or block) 226, a step (or block) 228, a step (or block) 230, a step (or block) 232, a step (or block) 234, a step (or block) 236, a step (or block) 238, a step (or block) 240 and a step (or block) 242. The method 220 may be implemented by the device 100c interacting with the data source 90.

In the step 222, the circuit 110 may initialize a buffer address to a top of the circuit 130. A first group of normal data items may be transferred, one at a time, from the data source 90 into the circuit 130 via the signal WDATA in the step 224. As a current data item is written into the circuit 130, the circuit 110 may count the number of logical zero bits and the number of logical one bits in the step 226. A check may be performed by the circuit 110 in the step 228 to determine if the bottom of the circuit 130 has been reached. If the circuit 130 is not full (e.g., the NO branch of step 228), the circuit 110 may increment the address in the step 230. A new current data item (e.g., second data item) may then be transferred from the data source 90 to the device 110c. The cycle may be repeated until the buffer becomes full.

When the buffer has been filled (e.g., the YES branch of step 228), the circuit 110 may examine the logical zero count and the logical one count. If the logical zero count is not greater than the logical one count (e.g., the NO branch of step 232), the circuit 110 may set the signal POL to the non-inverting condition and record the decision in the circuit 134 as part of the step 234. With the signal POL commanding no inversion, the circuit 132 may transfer the data items from the circuit 130 to the circuit 104 as-is in the step 236. If the logical zero count is greater than the logical one count (e.g., the YES branch of step 232), the circuit 110 may generate the signal POL in the inverting condition and record the decision in the circuit 134 as part of the step 238. Thereafter, the circuit 132 may invert the data items during a move from the circuit 130 to the circuit 104 in the step 240.

If more data is available from the data source 90 (e.g., the YES branch of step 242), the circuit 110 may clear the counters and reset the buffer address to the top of the buffer in the step 222. The process may be repeated until all of the data items have been moved to the circuit 130 and then moved to the circuit 104. Once all of the data items have been stored in the circuit 104 (e.g., the NO branch of step 242), the method 220 may be ended.

The method 220 generally creates multiple polarity values for multiple sets of data items, similar to the arrangement of FIG. 6. However, in the device 100c, a single signal POL may be used to pass the different polarity values to the circuit 108 depending on which set of data items is being read. The circuit 134 generally contains a map of which sets are to be inverted and which sets are not to be inverted.

The data inversion/non-inversion functions generally take place after the sensing operation and usually after the column decoding such that the amount of toggling due to the inversion is minimized (e.g., in a 16:1 column multiplexer, only 1 out of every 16 columns read would be inverted after being sensed). Some sensing schemes may incorporate the inversion capability within the sense amplifiers without any timing impact. Some sense amplifiers may have both a true output and a complimentary output. As such, a selection function of either the true output or the complimentary output may be placed between the sense amplifiers and the column multiplexers. For circuit 104 implementing self time sensing schemes, the data inversion/non-inversion functions may be performed after column multiplexing and prior to the sense amplifiers. Since the data inversion/non-inversion operations may be part of the self-timing path, such implementations may have no impact on the self-timing.

In some memory technologies, the data items are loaded into the circuit 104 during fabrication of the devices (e.g., 100b). For example, the data may be mask programmable or laser programmable. Therefore, inclusion/absence of the inverters 120 may be settled before fabrication of the device has finished. As such, the circuit 110 and the circuit 126 may be absent from the design. In the event that the inclusion/absence of the inverters 120 is outside of the sensing schemes such that the effect is directly translated into memory characterization data, the memory performance characterization may take into account the presence/absence of the inverters 120.

The actual incorporation/exclusion of the inverters 120 or non-inverting paths 122 may be a last minute mask programmable option dependent on the data set. The data set dependent impact on timing may easily be taken care of by characterizing the output data hold time with the inverter missing (e.g., previous data item reads disappears as soon as possible with no inverter delay holding the data items longer). The memory access time may be calculated with the inverters 120 in place, generally pushing out an access time.

Figure 11:
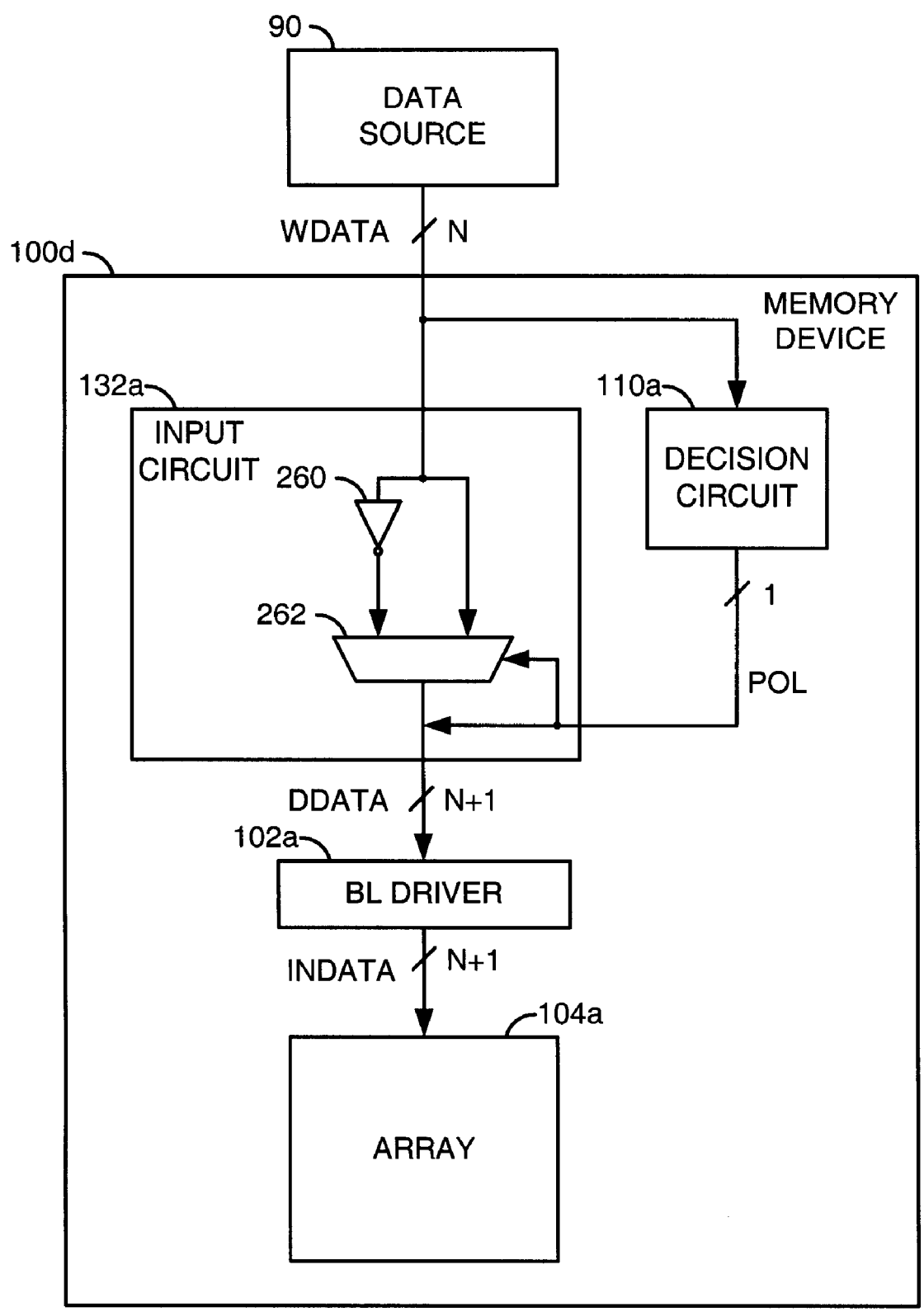
FIG. 11 is a block diagram of a fourth example implementation of a write portion of the device.

Referring to FIG. 11, a block diagram of a fourth example implementation of a write portion of a device 100d is shown. The device 100d may be a variation of the device 100a. The device 100d generally comprises a circuit (or module) 102a, a circuit (or module) 104a, a circuit (or module) 110a and a circuit (or module) 132a. The circuit 102a may be a variation of the circuit 102 with a capacity for an extra bit. The circuit 104a may be a variation of the circuit 104 with a capacity to store wider data items (e.g., 1 bit wider data items). The circuit 104a generally has at least one of a read port and/or a write port configured as single ended (e.g., a single bitline and a single pass gate into each bit cell). For the sake of discussion, both the read port and the write port may be treated as single ended.

The circuit 110a may implement a decision circuit. The circuit 110a may be a variation of the circuit 110. The circuit 110a may not have the functionality to read and write the signal MAP to and from the circuit 134 as does the circuit 110. The circuit 110a may be operational to encode (or process) the signal WDATA to generate the signal POL. The processing may be similar to that of the circuit 110 as shown in FIG. 10, but without the steps that loop through the buffer 130 counting the number of zeros and the number of ones.

The signal POL may convey an inversion bit, also referred to as an IBIT. The signal POL may indicate the non-inverting condition when the inversion bit is in the logical zero state. The inverting condition may be indicated when the inversion bit is in the logical one state. As such, reading the inversion bit from the circuit 104a (implementing a high precharge level) generally consumes less power when the inversion bit is in the logical one state.

The circuit 110a may be implemented as hardwired logic, memory or a combination thereof. In the fourth embodiment, the circuit 110a generally generates the signal POL in the inverting condition whenever most of the data bits in the signal WDATA are in the logical zero state under normal conditions. After inverting, a majority of the bits may be in the lower-power logical one state. Inversion of the data bits may also be performed where half of the data bits have the logical zero state and the other half of the data bits have the logical one state thereby causing the inversion bit to have the logical one state. As such, after the inversion bit is appended to the data bits, a majority of the bits may have the lower-power logical one state.

A similar technique may be applied for a low precharge version of the circuit 104a by inverting corresponding aspects of the invention. In such a case, the circuit 110a may set the signal POL to the non-inverting (e.g., low) condition when half or more of the data bits in the signal WDATA are in the logical zero state. As such, after the inversion bit is appended to the data bits, a majority of the bits may have the lower-power logical zero state.

The circuit 132a may implement an input circuit. The circuit 132a may be a variation of the circuit 132. The circuit 132a may include a capability to append the signal POL to the signal WDATA. The circuit 132a may be operational to (i) selectively invert/not invert the signal WDATA based on the signal POL to generate a signal (e.g., DDATA) and (ii) append the signal POL to the signal WDATA after inverting/not-inverting to complete the signal DDATA. In some embodiments, the IBIT value in the signal POL may be appended as the most significant bit to the data item in the signal WDATA.

In some embodiments, the circuit 132a may comprise a circuit (or module) 260 and a circuit (or module) 262. The circuit 260 may be implemented as an N-bit wide inverter. The circuit 260 is generally operational to generate an inverted version of the signal WDATA by inverting the signal WDATA on a bit-by-bit basis. The circuit 262 may implement a two-input N-bit wide multiplexer. The circuit 262 may be operational to pass either the non-inverted signal WDATA or the inverted version of the signal WDATA through to generated the first N bits of the signal DDATA. Selection of either the inverted or non-inverted versions of the signal WDATA is generally controlled by the signal POL. While the signal POL is in the inverting condition, the circuit 262 passes the inverted version of the signal WDATA. While the signal POL is in the non-inverting condition, the circuit 262 passes the signal WDATA unaltered.

During a write, if the data in the signal WDATA is found to be mostly low bits, writing the data as-is would result in most of the bitlines having to discharge in order to both write and read the data to and from the circuit 104a (e.g., high power consumption). To reduce the power consumption, the input data may be inverted by the circuit 132a prior to being written into the circuit 104a by the circuit 102a. The derived inversion bit generally controls the circuit 262 in the data input path such that either the real data (IBIT=0) or the inverted data (IBIT=1) is propagated to the write bitlines in the circuit 104a. The corresponding IBIT is written along with the data into the circuit 104a. The resulting write operation generally has a reduced power consumption related to the highly capacitive bitline toggling to be at most half of an original value.

Figure 12:
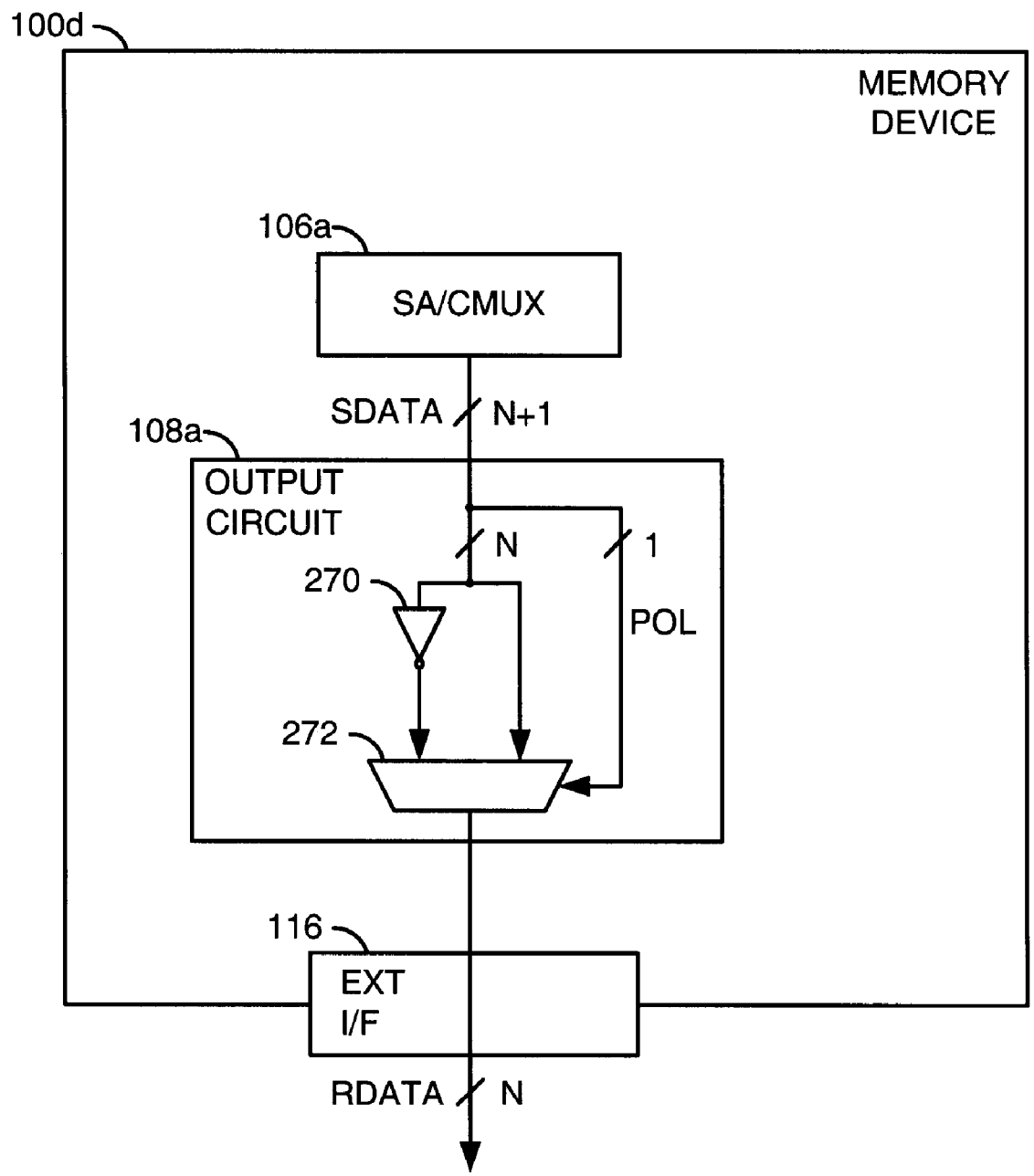
FIG. 12 is a block diagram of a fourth example implementation of a read portion of the device.

Referring to FIG. 12, a block diagram of a fourth example implementation of a read portion of the device 100d is shown. The device 100d may further comprise a circuit (or module) 106a and a circuit (or module) 108a coupled to the interface 116. The circuit 106a may be a variation of the circuit 106 with a capacity for an extra bit. The circuit 108a may be a variation of the circuit 108 with an added ability to parse the inversion bit from the signal SDATA.

During a read of a particular word from the circuit 104a, no more than half of the bits in the particular word create a discharging bitline due to the inversion/non-inversion applied during the write. As the IBIT value (appended to the particular word) is sensed by the circuit 106a, the IBIT value within signal POL may control the circuit 108a in the data output path to either (i) allow the actual sensed data in the signal SDATA propagate non-inverted (IBIT=0) to become the signal RDATA or (ii) invert the signal SDATA (IBIT=1) to generate the signal RDATA.

The circuit 108a generally comprises a circuit (or module) 270 and a circuit (or module) 272. The circuit 270 may implement an N-bit wide inverter. The circuit 270 may be operational to invert each bit of the signal SDATA on a bit-by-bit basis. The circuit 272 generally implements a two-input N-bit wide multiplexer. The circuit 272 may be operational to generate the signal RDATA from either the last N-bits of the non-inverted signal SDATA or the last N-bits of the inverted version of the signal SDATA. Control of the circuit 272 may be provided by the inversion bit in the signal POL as extracted (or parsed) from the signal SDATA.

With the above technique, the memory performance characterization generally accounts for the circuits 132a and 108a being in the write and/or read path or not. A resulting data write time may be increased slightly by (i) an inverting delay and a multiplexing delay and/or (ii) the circuit 110a delay to calculate the signal POL. The data output timing is generally altered as well. A data output hold time may behave as if the inversion is not applied (e.g., previous data disappears sooner). The access time may consider the inversion taking place and may be pushed out by the inverting and multiplexing delay. The power associated with toggling the appended inversion bit bitline may be much lower than that of the bitline movement that was eliminated. The power savings generally become more beneficial at higher row counts due to the increased bitline capacitance. Given the single ended sense application of the technique, the bitline movement for reads in applicable designs may be significant to get enough sensing margin. The movement may usually be on the order of Vdd/2 for inverter based sensing applications.

Referring to FIG. 13, a Table I illustrating a 4-bit word power savings is shown. As an example of the reduced bitline toggling rate, consider an example case of a 16×4 memory array (e.g., circuit 104). The overhead in the example may be high (e.g., 25% more bitlines per word) since a 5th bit column is added (e.g., circuit 104a) by the present invention. All possible data values that may be stored (0000, 0001, etc.) are considered in the table. Table I generally shows (i) the original 4-bit data word mapping, (ii) the number of bitlines that would have to toggle in order to write/read the original data (utilizing single ended reading and writing for the sake of the discussion), (iii) the 5-bit data word with the inversion bit encoded into the original data word and (iv) the resulting number of bitlines that would have to toggle in order to write/read the encoded (appended) word. Using the original data words, a write/read pass thru the entire address space generally results in 32 bitline transitions. With the encoded data words, the same pass thru the entire address space including the addition of the inversion bit generally results in 25 bitline transitions (e.g., 22% lower).

Referring to FIG. 14, a Table II illustrating power savings at various memory sizes is shown. The same analysis carried out for the 4-bit words in Table I may be carried out for other memory configurations where unique data may be stored in each address space (e.g., number of words=2^number of bits). Table II generally shows the same type of pattern stored in other memory sizes and the corresponding number of bitlines that may toggle both before and after the encoding to read the full address space.

As illustrated in Table II, greater power-saving benefits may be achieved by applying the present invention to larger memory arrays and larger word sizes. If the circuit 104a is written with only logical zero data, applying the above technique may eliminate all bitline toggling resulting in significant power savings. More generally, the bitline toggling and associated power consumption for any single ended memory operation may be reduced on the fly with minimal performance impact by implementing the present invention.

The present invention may minimize power consumption for memory devices based upon the data set being programmed. The modifications to (i) the data items within the data set and (ii) the signal POL to minimize the power consumption may be done any time the code is updated. For one-time programmable devices, such as mask programmable ROMs, the choice of including the inverters 120 and flipping all the ROM array data or including the non-inverting paths 122 may be easily accounted for in a last memory build prior to a tapeout.

The functions performed by the diagrams of FIGS. 1-14 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, magneto-optical disks, ROMS, RAMs, EPROMS, EEPROMs, Flash memory, magnetic or optical cards, or any type of media suitable for storing electronic instructions. As used herein, the term "simultaneously" is meant to describe events that share some common time period but the term is not meant to be limited to events that begin at the same point in time, end at the same point in time, or have the same duration.

While the invention has been particularly shown and described with reference to the preferred embodiments thereof, it will be understood by those skilled in the art that various changes in form and details may be made without departing from the scope of the invention.

The invention claimed is:

1. A method for conserving power in a device, comprising the steps of:
   (A) storing a plurality of data items in a memory array in a normal condition;
   (B) generating an inversion bit by analyzing a current one of said data items in said memory array, said current data item having a plurality of data bits, said inversion bit indicating that said current data item should be stored in one of (i) an inverted condition and (ii) a non-inverted condition relative to said normal condition such that a majority of said data bits have a first logic state if said majority exists in said current data item, wherein reading one of said data bits having said first logic state consumes less power than reading one of said data bits having a second logic state;
   (C) inverting each of said data bits of said current data item in response to said inversion bit indicating said inverted condition; and (D) storing said current data item in said memory array in said inverted condition.

2. The method according to claim 1, further comprising the step of:
appending said inversion bit to said current data item.

3. The method according to claim 2, further comprising the step of:
storing said inversion bit in said memory array as part of said current data item.

4. The method according to claim 2, wherein said inversion bit is appended to said current data item as a most significant bit.

5. The method according to claim 1, further comprising the step of:
reading said current data item with said inversion bit from said memory array during a read operation.

6. The method according to claim 5, further comprising the step of:
driving said current data item onto an external interface of said device in said normal condition during said read operation based on said inversion bit.

7. The method according to claim 5, further comprising the step of:
parsing said inversion bit from said current data item.

8. The method according to claim 7, further comprising the step of:
selectively either (i) inverting said current data item or (ii) not inverting said current data item based on said inversion bit after said parsing of said inversion bit from said current data item.

9. The method according to claim 1, wherein said inversion bit indicates inverting said current data item while said inversion bit is in said first state.

10. The method according to claim 1, wherein said inversion bit is generated to indicate that said current data item should be stored in said inverted condition in response to a first number of said data bits having said first logic state matching a second number of said second bits having said second logic state.

11. A device comprising:
a memory array configured to store a plurality of data items in a normal condition;
a circuit configured to (i) generate an inversion bit by analyzing a current one of said data items in said memory array, said current data item having a plurality of data bits, said inversion bit indicating that said current data item should be stored in one of (a) an inverted condition and (b) a non-inverted condition relative to said normal condition such that a majority of said data bits have a first logic state if said majority exists in said current data item, wherein reading one of said data bits having said first logic state consumes less power than reading one of said data bits having a second logic state, (ii) invert each of said data bits of said current data item in response to said inversion bit indicating said inverted condition and (iii) store said current data item in said memory array in said inverted condition.

12. The device according to claim 11, wherein said circuit is further configured to append said inversion bit to said current data item.

13. The device according to claim 12, wherein said inversion bit is stored in said memory array as part of said current data item.

14. The device according to claim 12, wherein said inversion bit is appended to said current data item as a most significant bit.

15. The device according to claim 11, wherein said circuit is further configured to read said current data item with said inversion bit from said memory array during a read operation.

16. The device according to claim 15, wherein said circuit is further configured to drive said current data item onto an external interface of said device in said normal condition during said read operation based on said inversion bit.

17. The device according to claim 15, wherein said circuit is further configured to parse said inversion bit from said current data item.

18. The device according to claim 17, wherein said circuit is further configured to selectively either (i) invert said current data item or (ii) not invert said current data item based on said inversion bit after said parsing of said inversion bit from said current data item.

19. The device according to claim 11, wherein said inversion bit indicates inverting said current data item while said inversion bit is in said first state.

20. A device comprising:
means for storing configured to store a plurality of data items in a normal condition;
means for deciding configured to generate an inversion bit by analyzing a current one of said data items in said means for storing, said current data item having a plurality of data bits, said inversion bit indicating that said current data item should be stored in one of (i) an inverted condition and (ii) a non-inverted condition relative to said normal condition such that a majority of said data bits have a first logic state if said majority exists in said current data item, wherein reading one of said data bits having said first logic state consumes less power than reading one of said data bits having a second logic state; and
means for writing configured to (i) invert each of said data bits of said current data item based on said inversion bit in response to said inversion bit indicating said inverted condition and (ii) store said current data item in said means for storing in said inverted condition.

* * * * *